(12) United States Patent
Thomson et al.

(10) Patent No.: US 12,720,870 B2
(45) Date of Patent: Aug. 25, 2026

(54) INTEGRATED CIRCUIT DEVICES WITH DIODES INTEGRATED IN SUBFINS

(71) Applicant: Intel Corporation, Santa Clara, CA (US)

(72) Inventors: Nicholas A. Thomson, Hillsboro, OR (US); Ayan Kar, Portland, OR (US); Kalyan C. Kolluru, Portland, OR (US); Benjamin John Orr, Beaverton, OR (US); Chu-Hsin Liang, Santa Cruz, CA (US); Biswajeet Guha, Hillsboro, OR (US); Saptarshi Mandal, Beaverton, OR (US); Brian Greene, Portland, OR (US); Sameer Jayanta Joglekar, Hillsboro, OR (US); Chung-Hsun Lin, Portland, OR (US); Mauro J. Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 17/850,414

(22) Filed: Jun. 27, 2022

(65) Prior Publication Data

US 2023/0420443 A1 Dec. 28, 2023

(51) Int. Cl.
*H10D 89/60* (2025.01)
*H10D 8/00* (2025.01)
(Continued)

(52) U.S. Cl.
CPC ............ *H10D 89/611* (2025.01); *H10D 8/00* (2025.01); *H10D 30/62* (2025.01);
(Continued)

(58) Field of Classification Search
CPC .... H10D 84/811; H10D 89/611; H10D 30/62; H10D 62/121; H10D 84/834; H10D 30/6735
See application file for complete search history.

(56) References Cited

U.S. PATENT DOCUMENTS

2020/0105747 A1 4/2020 Lee et al.
2021/0193836 A1* 6/2021 Guha .................... H10D 86/60
(Continued)

*Primary Examiner* — Britt Hanley
*Assistant Examiner* — Jason James Greaving
(74) *Attorney, Agent, or Firm* — Akona IP PC

(57) ABSTRACT

Integrated circuit (IC) devices with diodes formed in a subfin between a support structure of an IC device and one or more nanoribbon stacks are disclosed. To alleviate challenges of limited semiconductor cross-section provided by the subfin, etch depths in the subfin (i.e., depths of recesses in the subfin formed as a part of forming the diodes) are selectively optimized and varied. Deeper recesses are made in subfin portions at which diode terminals (e.g., anodes and cathodes) are formed, to increase the semiconductor cross-section in those portions, thus providing improved subfin contacts. Shallower recesses (or no recesses) are made in subfin portion between the diode terminals, to increase subfin retention. Thus, subfin diodes may be provided in a manner that enables improved diode conductance and/or improved current carrying capabilities while advantageously using substantially the same etch processes as those used for forming nanoribbon-based transistors elsewhere in the IC device.

22 Claims, 9 Drawing Sheets

(51) Int. Cl.
*H10D 30/62* (2025.01)
*H10D 62/10* (2025.01)
*H10D 84/83* (2025.01)
*H10P 14/20* (2026.01)

(52) U.S. Cl.
CPC ......... *H10D 62/121* (2025.01); *H10D 84/834* (2025.01); *H10P 14/3462* (2026.01)

(56) References Cited

U.S. PATENT DOCUMENTS

| | | | | |
|---|---|---|---|---|
| 2021/0305436 | A1 | 9/2021 | Kar et al. | |
| 2021/0391320 | A1 | 12/2021 | Wang et al. | |
| 2022/0077140 | A1 | 3/2022 | Thomson et al. | |
| 2022/0199610 | A1* | 6/2022 | Guha | H01L 23/60 |

* cited by examiner 200
228
224
230
x
z 200
x
z 200
228
232
224
x
z 202
204
206
208
210
212
214
310

INTEGRATED CIRCUIT DEVICES WITH DIODES INTEGRATED IN SUBFINS

BACKGROUND

A diode is a two-terminal electronic component that conducts current primarily in one direction. Semiconductor diodes are one of the key components for a variety of applications in complementary metal-oxide-semiconductor (CMOS) technology and beyond. For example, with CMOS process technology scaling, the robustness of transistors may be compromised due to the lower breakdown voltage for thinner gate oxides used in scaled transistors. Consequently, the protection of the transistor gates from any electrostatic discharge (ESD) currents becomes increasingly difficult to achieve, especially as high-speed applications put strict requirements on the designs. Since semiconductor diodes are one of the key components for ESD protection circuitry, exploring new designs for diode arrangements may lead to improvements in this important application, as well as in other applications where electronic components are used.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
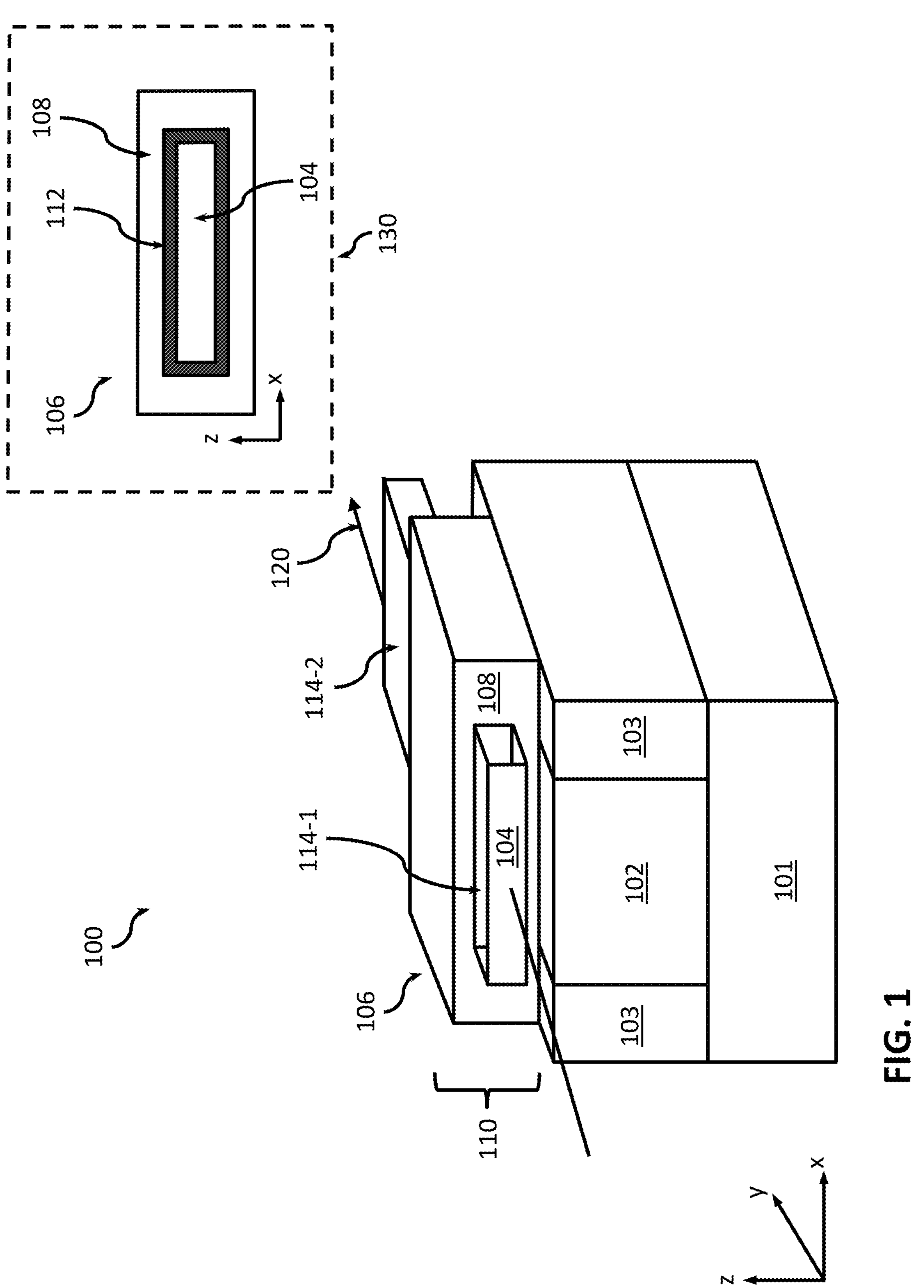
FIG. 1 is a perspective view of an example nanoribbon-based integrated circuit (IC) device in which one or more subfin diodes may be implemented, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Diodes are used for various applications including, but not limited to, ESD protection and thermal sensing. It is desirable to integrate diodes and transistors, e.g., field-effect transistors (FETs) on a single substrate. When transistors are either planar FETs or fin-based FETs (FinFETs), integration may be relatively straightforward in that the contact etch process developed for transistors may also be used for forming diodes as the current paths for diodes or transistors may utilize a similar portion of a semiconductor substrate over which these transistors and diodes are formed. Further, planar and fin-based transistor technologies may advantageously provide a large semiconductor cross-section through which current (e.g., ESD current) can flow, benefiting diodes.

On the other hand, in nanoribbon-based transistor technologies, the cross-sectional area of a semiconductor material in which diodes could be formed may be constrained. In such technologies, an IC device may include a stack of nanoribbons and one or more gate stacks (or gate electrodes). The nanoribbons are elongated semiconductor structures, typically vertically stacked above one another and extending substantially parallel to the substrate of the IC device, and the one or more gate stacks may at least partially wrap around each nanoribbon in the stack. Such nanoribbon-based transistor technologies may focus and/or optimize the designs and functionalities for the nanoribbons, the gate stacks, and/or associated contacts that form nanoribbon-based transistors, and not specifically for diode formation. For instance, in contrast to planar transistors and FinFETs, there is no substrate on the back side of the nanoribbons in which a junction of P-type and N-type semiconductor materials (PN junction) can be formed. While a portion of a semiconductor material remains in a fin-like portion below the stack of nanoribbons (such portion referred to herein as a "subfin" or as an "elongated semiconductor structure"), between the stack of nanoribbons and a corresponding support structure (e.g., a substrate, a die, a wafer, or a chip), the subfin may not have a sufficient semiconductor cross-section for effective diode formation.

To address the challenges described above, in one approach, diodes can be formed in separate regions of an IC device, utilizing fabrication processes different from fabrication processes that are used to form nanoribbon-based transistors (e.g., using fins for formation of diodes and nanoribbons for formation of transistors). However, utilizing separate processes for formation of diodes and formation of transistors may be undesirable. For instance, the separate processes can increase cost and complexity as two separate, incongruous features may have to coexist and be independently supported and debugged.

Embodiments of the present disclosure provide IC devices with diodes formed in a subfin between a support structure of an IC device and one or more nanoribbon stacks. The present disclosure may refer to such diodes as "subfin diodes." To alleviate the challenges of limited semiconductor cross-section provided by the subfin, described above, etch depths in the subfin (i.e., depths of recesses in the subfin formed as a part of forming the diodes) are selectively optimized and varied. The variation of the etch depths in a subfin is in contrast to conventional nanoribbon-based IC devices (e.g., for transistors) in which subfin etch depths are about the same throughout the IC device. Stated differently, IC devices with nanoribbon stacks and subfin diodes as disclosed herein may have recesses in the subfin with different etch depths at different portions of the subfin diodes. Deeper recesses can be made in subfin portions at which diode terminals (e.g., anodes and cathodes) are formed, to increase the semiconductor cross-sections in those portions, thus providing improved subfin contacts. Improved subfin contacts may increase diode conductance and/or improve diode ideality (e.g., a measure of how close the diode operations follow the ideal diode equation). Shallower recesses (or no recesses) can be made in subfin portion between the diode terminals, to increase subfin retention. The increased subfin retention can increase the current carrying capability of the diode. The varying subfin etch depths can be achieved by modulating or varying spaces (e.g., separation distances) between nearest-neighbor pairs of gate stacks that wrap around the nanoribbons. The variation of the spaces between nearest-neighbor pairs of gate stacks is in contrast to conventional nanoribbon-based IC devices (e.g., for transistors) in which gate stacks are uniformly spaced throughout the IC device. The disclosed embodiments may advantageously provide diodes in a subfin below one or more nanoribbons in a manner that enables improved diode conductance and/or improved current carrying capabilities while advantageously using substantially the same etch processes as those used for forming nanoribbon-based transistors elsewhere in the IC device.

According to an embodiment of the present disclosure, an IC device may include a subfin. The subfin may be an elongated semiconductor structure, i.e., a structure of one or more semiconductor materials where a length of the structure is greater than a height and a width of the structure. For a coordinate system having a first, a second, and a third axes perpendicular to one another, the length of the subfin may be defined as a dimension measured along the first axis, the height of the subfin may be defined as a dimension measured along the second axis, and the width of the subfin may be defined as a dimension measured along the third axis. Each of the first axis and the third axis may be substantially parallel to a support structure (e.g., a substrate, a die, a wafer, a chip, a carrier substrate, etc.) over which the subfin is provided and substantially perpendicular to one another, while the second axis may be substantially perpendicular to the support structure. Thus, the subfin extends along the first axis (which may be referred to as a "longitudinal axis" of the subfin) and a dimension of the subfin along the first axis is greater than dimensions of the subfin along the second axis and along the third axis. Sidewalls of the subfin may be enclosed by an insulator material. The subfin may include a plurality of alternating first and second doped regions (e.g., N-wells and P-wells) adjacent to (e.g., in contact with) one another along the first axis. The first and second doped regions may be regions of one or more semiconductor materials with different types of dopants (e.g., N-type dopants and P-type dopants). The IC device may further include at least one nanoribbon, but typically a stack of nanoribbons (i.e., a plurality of nanoribbons stacked above one another), over the first and second doped regions, the nanoribbons extending horizontally (i.e., substantially parallel to the support structure) along the first axis. The IC device may further include a plurality of first structures (e.g., gate stacks or gate electrodes) spaced apart from each other along the first axis. Each first structure may include an electrically conductive material at least partially wrapping around each of the nanoribbons of the stack and may extend vertically (i.e., substantially perpendicular to the support structure) along the second axis away from one of the first and second doped regions. The IC device may further include a plurality of second structures (e.g., P-type doped structures and N-type doped structures) spaced apart from each other by at least one of the first structures. An individual second structure may include a semiconductor material extending, along the second axis, through each of the nanoribbons of the stack and vertically away from one of the first and second doped regions. A distance between a nearest-neighbor pair of two of the first structures with one of the second structures therebetween may be greater than a distance between a nearest-neighbor pair of two of the first structures with none of the second structures therebetween.

Each of the structures, packages, methods, devices, and systems of the present disclosure may have several innovative aspects, no single one of which being solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium arsenide" or "GaAs" may refer to a material that includes Gallium and Arsenic). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−10% of a target value based on the context of a particular value as described herein or as known in the art.

The term "interconnect" may refer to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 3A-3C, such a collection may be referred to herein without the letters, e.g., as "FIG. 3." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC devices with subfin diodes as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with subfin diodes as described herein may be implemented in one or more components associated with an IC or/and between various such components. In various embodiments, components associated with an IC include, for example, transistors, diodes, power sources, resistors, capacitors, inductors, sensors, transceivers, transmitters, receivers, antennas, etc. Components associated with an IC may include those that are mounted on an IC, provided as an integral part of an IC, or those connected to an IC. The IC may be either analog or digital, or may include a combination of analog and digital circuitry, and may be used in a number of applications, such as microprocessors, optoelectronics, logic blocks, audio amplifiers, etc., depending on the components associated with the IC. In some embodiments, IC devices with subfin diodes as described herein may be included in a RFIC, which may, e.g., be included in any component associated with an IC of an RF receiver, an RF transmitter, or an RF transceiver, or any other RF device, e.g., as used in telecommunications within base stations (BS) or user equipment (UE) devices. Such components may include, but are not limited to, power amplifiers, RF switches, RF filters (including arrays of RF filters, or RF filter banks), or impedance tuners. In some embodiments, the IC devices with subfin diodes as described herein may be employed as part of a chipset for executing one or more related functions in a computer.

FIG. 1 is a perspective view of an example nanoribbon-based IC device 100 in which one or more subfin diodes as described herein may be implemented, according to some embodiments of the present disclosure. The nanoribbon-based IC device 100 is one example where a subfin 102 between a nanoribbon 104 and a support structure 101 may be used to construct diodes as discussed herein.

Turning to the details of FIG. 1, the IC device 100 may include a semiconductor material, which may include one or more semiconductor materials, formed as a nanoribbon 104 extending substantially parallel to a support structure 101. A transistor 110 may be formed on the basis of the nanoribbon 104 by having a gate stack 106 wrap around at least a portion of the nanoribbon referred to as a "channel portion" and by having source and drain regions, shown in FIG. 1 as a first source or drain (S/D) region 114-1 and a second S/D region 114-2, on either side of the gate stack 106. One of the S/D regions 114 is a source region and the other one is a drain region. However, because, as is common in the field of FETs, designations of source and drain are often interchangeable, they are simply referred to herein as a first S/D region 114-1 and a second S/D region 114-2. In some embodiments, a layer of oxide material (not specifically shown in FIG. 1) may be provided between the support structure 101 and the gate stack 106.

The IC device 100 shown in FIG. 1, as well as IC devices shown in other drawings of the present disclosure, is intended to show relative arrangements of some of the components therein, and the IC device 100, or portions thereof, may include other components that are not illustrated (e.g., electrical contacts to the S/D regions 114 of the transistor 110, additional layers such as a spacer layer around the gate electrode of the transistor 110, etc.). For example, although not specifically illustrated in FIG. 1, a dielectric spacer may be provided between a first S/D electrode (which may also be referred to as a "first S/D contact") coupled to a first S/D region 114-1 of the transistor 110 and the gate stack 106 as well as between a second S/D electrode (which may also be referred to as a "second S/D contact") coupled to a second S/D region 114-2 of the transistor 110 and the gate stack 106 in order to provide electrical isolation between the source, gate, and drain electrodes. In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Implementations of the present disclosure may be formed or carried out on any suitable support structure 101, such as a substrate, a die, a wafer, or a chip. The support structure 101 may, e.g., be the wafer 2000 of FIG. 5, discussed below, and may be, or be included in, a die, e.g., the singulated die 2002 of FIG. 5, discussed below. The support structure 101 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 101 may be a printed circuit board (PCB) substrate. Although a few examples of materials from which the support structure 101 may be formed are described here, any material that may serve as a foundation upon which an IC device implementing threshold voltage tuning for nanoribbon-based transistors as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 101 may provide material "support" in that, e.g., the IC devices/structures are build based on the semiconductor materials of the support structure 101. However, in some embodiments, the support structure 101 may provide mechanical support.

The nanoribbon 104 may take the form of a nanowire or nanoribbon, for example. In some embodiments, an area of a transversal cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). In some embodiments, a width of the nanoribbon 104 (i.e., a dimension measured in a plane parallel to the support structure 101 and in a direction perpendicular to a longitudinal axis 120 of the nanoribbon 104, e.g., along the y-axis of the example coordinate system shown in FIG. 1) may be at least about 3 times larger than a height of the nanoribbon 104 (i.e., a dimension measured in a plane perpendicular to the support structure 101, e.g., along the z-axis of the example coordinate system shown in FIG. 1), including all values and ranges therein, e.g., at least about 4 times larger, or at least about 5 times larger. Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The term “face” of a nanoribbon may refer to the side of the nanoribbon 104 that is larger than the side perpendicular to it (when measured in a plane substantially perpendicular to the longitudinal axis 120 of the nanoribbon 104), the latter side being referred to as a “sidewall” of a nanoribbon.

In various embodiments, the semiconductor material of the nanoribbon 104 may be composed of semiconductor material systems including, for example, N-type or P-type materials systems. In some embodiments, the nanoribbon 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the nanoribbon 104 may include a combination of semiconductor materials. In some embodiments, the nanoribbon 104 may include a monocrystalline semiconductor, such as silicon (Si) or germanium (Ge). In some embodiments, the nanoribbon 104 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 110 is an N-type metal-oxide-semiconductor (NMOS) transistor), the channel material of the nanoribbon 104 may include a III-V material having a relatively high electron mobility, such as, but not limited to InGaAs, InP, InSb, and InAs. For some such embodiments, the channel material of the nanoribbon 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (i.e., for the embodiments where the transistor 110 is a P-type metal-oxide-semiconductor (PMOS) transistor), the channel material of the nanoribbon 104 may advantageously be a group IV material having a high hole mobility, such as, but not limited to Ge or a Ge-rich SiGe alloy. For some example embodiments, the channel material of the nanoribbon 104 may have a Ge content between 0.6 and 0.9, and advantageously may be at least 0.7.

In some embodiments, the channel material of the nanoribbon 104 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel material of the nanoribbon 104 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the nanoribbon 104 may have a thickness between about 5 and 75 nanometers, including all values and ranges therein. In some embodiments, a thin-film channel material may be deposited at relatively low temperatures, which allows depositing the channel material within the thermal budgets imposed on back-end fabrication to avoid damaging other components, e.g., front end components such as the logic devices.

A gate stack 106 including a gate electrode material 108 and, optionally, a gate dielectric material 112, may wrap entirely or almost entirely around a portion of the nanoribbon 104 as shown in FIG. 1, with the active region (channel region) of the channel material of the transistor 110 corresponding to the portion of the nanoribbon 104 wrapped by the gate stack 106. The gate dielectric material 112 is not shown in the perspective drawing of the IC device 100 shown in FIG. 1, but is shown in an inset 130 of FIG. 1, providing a cross-sectional side view of a portion of the nanoribbon 104 with a gate stack 106 wrapping around it. As shown in FIG. 1, the gate dielectric material 112 may wrap around a transversal portion of the nanoribbon 104 and the gate electrode material 108 may wrap around the gate dielectric material 112.

The gate electrode material 108 may include at least one P-type work function metal or N-type work function metal, depending on whether the transistor 110 is a PMOS transistor or an NMOS transistor (P-type work function metal used as the gate electrode material 108 when the transistor 110 is a PMOS transistor and N-type work function metal used as the gate electrode material 108 when the transistor 110 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric material 112 may include one or more high-k dielectrics including any of the materials discussed herein with reference to the insulator material that may surround portions of the transistor 110. In some embodiments, an annealing process may be carried out on the gate dielectric material 112 during manufacture of the transistor 110 to improve the quality of the gate dielectric material 112. The gate dielectric material 112 may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

As further shown in FIG. 1, the IC device 100 may include a subfin 102 and an insulator material 103 over the support structure 101. The subfin 102 may be an elongated semiconductor structure extending along the y-axis of the example coordinate system shown in FIG. 1. For instance, a dimension (e.g., a length) of the subfin 102 along the y-axis may be greater than a dimension (e.g., a width) of the subfin 102 along the x-axis and a dimension (e.g., a height or depth) of the subfin 102 along the z-axis. The insulator material 103 may enclose the longitudinal sidewalls of the subfin 102. The subfin 102 enclosed in the insulator material 103 may be between the nanoribbon 104 and the support structure 102. Stated differently, the nanoribbon 104 with the wrapped gate stack 106 may be over the subfin 102 and the insulator material 103. More specifically, the nanoribbon 104 may be approximately aligned to the subfin 102 along the x-axis and the y-axis (e.g., or the x-y plane).

The insulator material 103 is commonly referred to as a "shallow trench isolation" (STI). The STI material 103 may be an oxide or any suitable ILD. In some embodiments, the STI material 103 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 103 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. The subfin 102 may include one or more semiconductor materials and may include regions doped with impurities (e.g., P-type dopants and N-type dopants). In some embodiments the subfin 102 may include alternating P-type doped regions and N-type doped regions as will be discussed more fully below with reference to FIG. 2.

While FIG. 1 illustrates the IC device 100 including one gate stack 106 wrapped around the nanoribbon 104, aspects are not limited thereto. For instance, the IC device 100 may include multiple gate stacks similar to the gate stacks 106 spaced apart from each other along the direction of the y-axis and each gate stack may wrap around at least a portion of the nanoribbon 104. Further, the IC device 100 may include multiple nanoribbons similar to the nanoribbons 104 stacked vertically along the z-axis, where the gate stacks may wrap around at least a portion of each nanoribbon.

Figure 2:
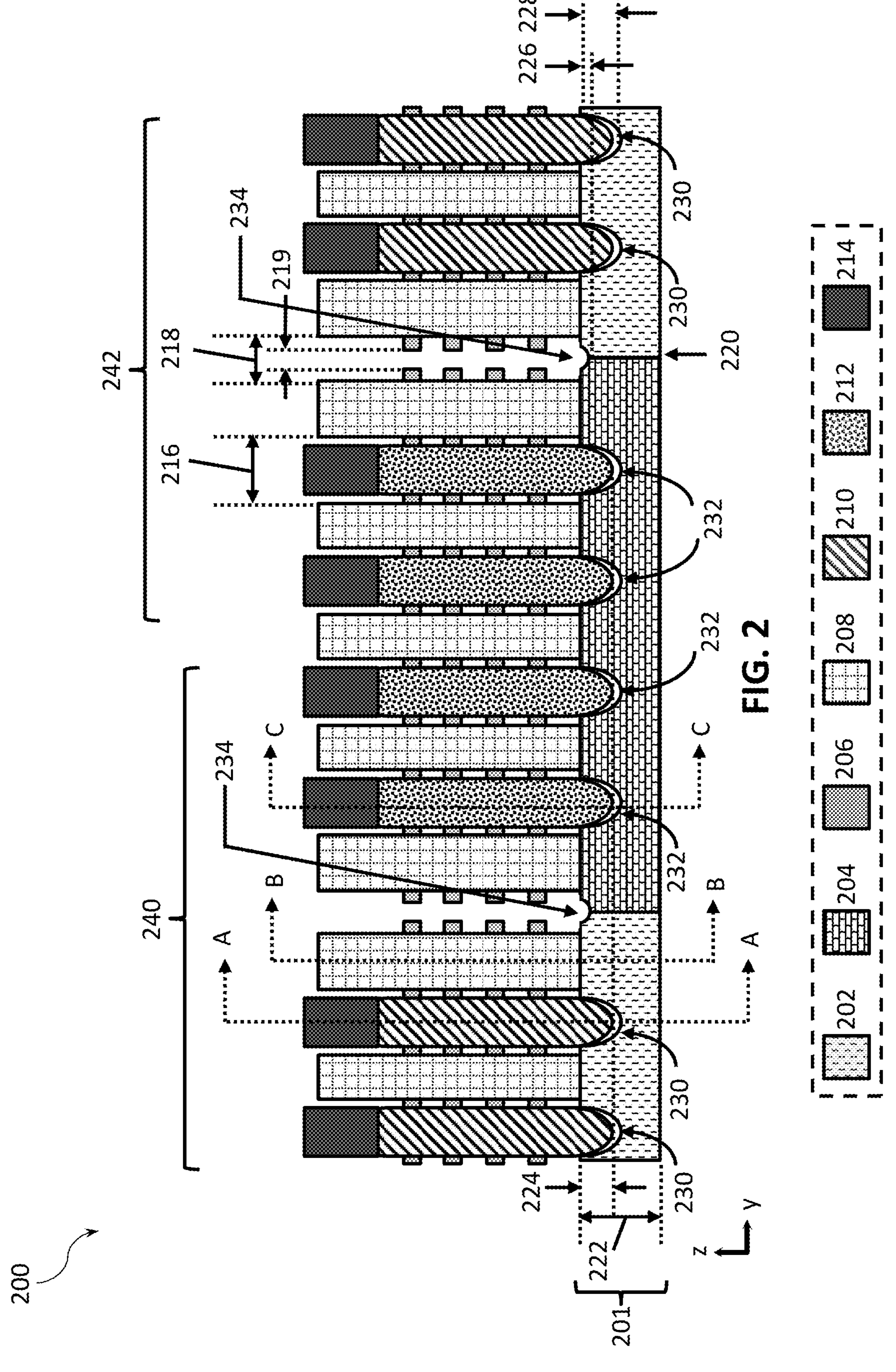
FIG. 2 is a longitudinal cross-sectional view of an IC device with example subfin diodes, according to some embodiments of the disclosure.

FIG. 2 is a longitudinal cross-sectional view of an IC device 200 with example subfin diodes 240 and 242, according to some embodiments of the disclosure. A legend provided within a dashed box at the bottom of FIG. 2 illustrates colors/patterns used to indicate some of the elements of the IC device 200 so that FIG. 2 is not cluttered by too many reference numerals. For example, FIG. 2 uses different colors/patterns to illustrate P-wells 202, an N-well 204, nanoribbons 206, gate stacks 208, P-type doped structures 210, N-type doped structure 212, and contacts 214.

The IC device 200 may be similar to the IC device 100 of FIG. 1 in many respects. For instance, the IC device 200 may include one or more stacks of nanoribbons 206 over a subfin portion (or subfin structure) 201, where the nanoribbons 206 may be similar to the nanoribbon 104 and the subfin portion 201 may be similar to the subfin 102. Further, the IC device 200 may include gate stacks 208 wrapped around at least a portion of each of the nanoribbons 206, where the gate stacks 208 may be similar to the gate stack 106. The cross-sectional view shown in FIG. 2 may be along y-z plane of the IC device 200, where the y-z plane may correspond to the y-z plane of the IC device 100 of FIG. 1. While not shown in FIG. 1, the IC device 200 may also include a support structure (e.g., a die, a substrate, a chip, etc.) similar to the support structure 101 of FIG. 1 over which the subfin portion 201 may be provided and the longitudinal sidewalls of the subfin portion 210 may be enclosed by STI material similar to the STI material 103 as discussed above with reference to FIG. 1.

The subfin portion 201 may include a plurality of alternating P-wells 202 and N-wells 204 adjacent to (e.g., in contact with) one another along the y-axis. For simplicity, FIG. 2 illustrates two P-wells 202 and one N-well 204 between the P-wells 202. In general, the subfin portion 201 may include any suitable number of alternating P-wells 202 and N-wells 204 (e.g., about 2, 3, 4, 5, 6, 7, 8, 9 or more).

As used herein, the N-well 204 and the P-wells 202 refer to regions of a semiconductor material (which may include a plurality of different semiconductor materials) doped with, respectively N-type dopants and P-type dopants, in dopant concentrations that are higher than the dopant concentration in the support structure outside of these wells. In some embodiments, a dopant concentration of the N-well 204 or the P-wells 202 may be greater than the dopant concentration of the support structure. For instance, the dopant concentration of the N-well 204 and the P-wells 202 may be between about $5\times10^{16}$ dopants per cubic centimeter and $5\times10^{18}$ dopants per cubic centimeter, and the dopant concentration of the support structure may be lower than about $10^{16}$ dopants per cubic centimeter, e.g., lower than about $5\times10^{15}$ dopants per cubic centimeter. As is known in the field of semiconductor devices, both N-type and P-type dopants may be present within a semiconductor material, but the term "N-well" refers to a doped well where the amount of N-type dopants is higher, typically significantly higher, than the amount of P-type dopants, while the term "P-well" refers to a doped well where the amount of P-type dopants is higher, typically significantly higher, than the amount of N-type dopants. Similarly, the term "N-doped region" refers to a doped region where the amount of N-type dopants is higher, typically significantly higher, than the amount of P-type dopants, while the term "P-doped region" refers to a doped region where the amount of P-type dopants is higher, typically significantly higher, than the amount of N-type dopants. Reference to a "dopant concentration" in these P-wells 202 and N-well 204 implies dopant concentrations of the type of dopants with the greater amount. For example, a dopant concentration of the N-well 204 being at a certain level refers to the dopant concentration of the N-type dopants, while a dopant concentration of the P-wells 202 being at a certain level refers to the dopant concentration of the P-type dopants.

The nanoribbons 204 may extend horizontally in a direction of the y-axis and may be stacked vertically along the z-axis, which may be about perpendicular to the y-axis. Further, each of the nanoribbons 204 within a vertical stack may be spaced apart from each other along the z-axis. More specifically, the IC device 200 may include multiple separate, vertical stacks of horizontal nanoribbons 206, where each stack may be over a different one of the P-wells 202 and N-well 204. In some embodiments, the nanoribbons 206 may include one or more semiconductor materials as discussed above with reference to FIG. 1.

The gate stacks 208 may be spaced apart from each other along the y-axis. The gate stacks 208 may include an electrically conductive material (e.g., a metal or any suitable materials typically used as gate electrode materials). Each gate stack 208 may wrap around at least a portion of each nanoribbon 206 in a respective vertical stack of nanoribbons 206. Each of the gate stack 208 may extend vertically along the z-axis away from a respective one of the P-well 202 or N-well 204.

The IC device 200 may further include a plurality of P-type doped structures 210 and N-type doped structures 212 spaced apart from each other along the y-axis and spaced apart from each other by at least one of the gate stacks 208. Each of the P-type doped structures 210 may extend vertically along the z-axis away from a respective P-well 202. In a similar way, each of the N-type doped structures 212 may extend vertically along the z-axis away from a respective N-well 204. For instance, each of the P-type doped structure 210 may include a portion enclosed by a respective P-well 202 (or extend into, or below the surface of the respective P-well 202), and each of N-type doped structures 212 may include a portion enclosed by a respective N-well 204 (or extend into or below the surface of the respective N-well 204). In some embodiments, each of the P-type doped structures 210 and N-type doped structures 210 may extend through each nanoribbon 208 in a respective stack of nanoribbons 208. In other embodiments, each of the P-type doped structures 210 and N-type doped structures 210 may at least partially wrap around each nanoribbon 208 in a respective stack of nanoribbons 208. In general, each of the P-type doped structures 210 and N-type doped structures 210 may extend through each nanoribbon 208 in a respective stack of nanoribbons 208 and/or at least partially wrap around each nanoribbon 208 in the 15 respective stack of nanoribbons 208.

In some embodiments, the P-type doped structures 210 may include one or more semiconductor materials including P-type dopants, and the N-type doped structures 211 may include one or more semiconductor materials including N-type dopants. In some embodiments, a dopant concentration of the semiconductor material of the P-type doped structures 210 and/or a dopant concentration of the semiconductor material of the N-type doped structures 212 structures may be at least $10^{19}$ dopants per square centimeter. In some examples, a dopant concentration of the semiconductor material of the P-type doped structures 210 and/or a dopant concentration of the semiconductor material of the N-type doped structures 212 structures may be at least $10^{20}$ dopants per square centimeter. In some embodiments, a dopant concentration of the one or more semiconductor materials of the P-wells 202 and N-well 204 may be at least $10^{16}$ dopants per square centimeter. In some examples, a dopant concentration of the one or more semiconductor materials of the P-wells 202 and N-well 204 may be at least $10^{18}$ dopants per square centimeter. In general, the dopant concentrations of the P-wells 202 and/or the N-well 204 may be lower the dopant concentrations of the P-type doped structures 210 and/or the N-type doped structures 212. Further, as discussed above, the subfin portion 201 may be over a support structure (e.g., a die or substrate) similar to the support structure 101. In general, the dopant concentrations of the P-wells 202 and/or the N-well 204 may be greater than a dopant concentration of the support structure.

In some embodiments, along the z-axis, a dimension 224 of the portion of a P-type doped structure 210 or an N-type doped structure 212 enclosed by a respective P-well 202 or N-well 204 may be between about 20% and 80% of a dimension 222 of the respective P-well 202 or N-well 204. In other examples, the dimension 224 of the portion of a P-type doped structure 210 or an N-type doped structure 212 enclosed by a respective P-well 202 or N-well 204 may be between about 30% and 70% of the dimension 222 of the respective P-well 202 or N-well 204. In yet other examples, the dimension 224 of the portion of a P-type doped structure 210 or an N-type doped structure 212 enclosed by a respective P-well 202 or N-well 204 may be between about 40% and 60% of the dimension 222 of the respective P-well 202 or N-well 204.

As further shown in FIG. 2, a recess 230 may be at a P-well 202 between each nearest-neighbor pair of gate stacks 208 extending from the respective P-well 202. In a similar way, a recess 232 may be at an N-well 204 between each nearest-neighbor pair of gate stacks 208 extending from the respective N-well 204. Each recess 230, 232 may extend along the z-axis into at least one of the P-wells 202 or the N-well 204. The recesses 230 and 232 may result from the process used for forming the gate stacks 208. In general, the gate stacks 208 may be formed using any suitable processes, such as an implantation/diffusion process or an etching/deposition process discussed below. In some embodiments, the gate stacks 208 may be formed using an etching process.

A P-type doped structure 210 or an N-type doped structure 212 may be located at each recess 230 or 232, respectively. More specifically, a P-type doped structure 210 may extend along the z-axis into a P-well 202 and may include a portion within a respective recess 230. In a similar way, an N-type doped structure 212 may extend along the z-axis into an N-well 204 and may include a portion within a respective recess 232. In general, the P-type doped structures 210 and the N-type doped structures 212 may be formed using any suitable processes, such as an implantation/diffusion process or an etching/deposition process discussed below. In some embodiments, an epitaxial deposition process may be used to fill the recesses 230 and 232 with material that is used to fabricate the respective P-type doped structures 210 and N-type doped structures 212, respectively. Accordingly, the P-type doped structures 210 may be referred to as P-type epitaxially grown semiconductor (p-epi), and the N-type doped structures 212 may be referred to as N-type epitaxially grown semiconductor (n-epi). In some implementations, the P-type doped structures 210 and N-type doped structures 212 may be fabricated using a silicon alloy such as silicon germanium or silicon carbide. In some implementations, the epitaxially deposited silicon alloy may be doped in situ with dopants such as boron, arsenic, or phosphorous. In further embodiments, the P-type doped structures 210 and N-type doped structures 212 may be formed using one or more alternate semiconductor materials such as germanium or a group III-V material or alloy. And in further embodiments, one or more layers of metal and/or metal alloys may be used to form the P-type doped structures 210 and N-type doped structures 212.

As further shown in FIG. 2, a recess 234 may be between a nearest-neighbor pair of gate stacks 208 across a junction 220 or interface between a P-well 202 and an adjacent N-well 204 (in contact with the P-well 202). While FIG. 2 illustrates each recess 234 to be at a junction 220 between a P-well 202 and an immediate adjacent N-well 204, aspects are not limited thereto. For instance, a recess 234 may be formed at any location (e.g., only at a P-well 202 or only at an N-well 204) between a nearest-neighbor pair of gate stacks 208 with one gate stack 208 extending from the P-well 202 and the other gate stack 208 extending from the adjacent N-well 204. The recesses 234 may also be a result of the process used for forming the gate stacks 208 discussed above.

In contrast to conventional nanoribbon-based IC devices where all subfin recesses between gate stacks (e.g., the gate stacks 208) may have about the same depth or same dimension along the z-axis, the recesses 234 may have a different depth or different dimension along the z-axis than the recesses 230 and 232. As shown, a recess 230 at which a P-type doped structure 210 is formed or a recess 232 at which an N-type doped structure 212 is formed may have a depth or dimension 228 along the z-axis that is greater than a depth or dimension 226 of a recess 234 at which no P-type doped structure 210 or N-type doped structure 212 is formed. In this way, the deeper-depth recess 230 at which a P-type doped structure 210 is formed or the recess 232 at which an N-type doped structure 212 is formed can provide a larger subfin (or Si) cross-section, and thus can allow for a better contact between the Si cross-section and the respective P-type doped structure 210 or N-type doped structure 212. On the other hand, the shallower-depth recess 234 at which no P-type doped structure 210 or N-type doped structure 212 is formed (e.g., across a junction 220 of a P-well 202 and an N-well 204) can increase subfin retention.

The IC devices 200 as shown in FIG. 2 may be generalized as an IC device that includes a plurality of alternating first and second doped regions (e.g., the P-wells 202 and the N-well 204) adjacent to (e.g., in contact) with one another along an axis (e.g., the y-axis in the example coordinate system shown in FIG. 2). The first and second doped regions may be regions of one or more semiconductor materials with different types of dopants (e.g., P-type dopants and N-type dopants). The IC device may further include a stack of nanoribbons (e.g., the nanoribbons 206) over the first and second doped regions and extending horizontally along the axis. The IC device may further include a plurality of first structures (e.g., the gate stacks 208) spaced apart from each other along the axis. An individual first structure may include an electrically conductive material at least partially wrapping around each of the nanoribbons of the stack and extending vertically away from one of the first and second doped regions. The IC device may further include a plurality of second structures (e.g., the P-type doped structures 210 and N-type doped structures 212) spaced apart from each other by at least one of the first structures. An individual second structure may include a semiconductor material extending through each of the nanoribbons of the stack and vertically away from one of the first and second doped regions.

In various embodiments of the IC device 200, along the z-axis, a dimension 222 of each of the P-wells 202 and N-well 204 may be between about 50 to 150 nanometers. In some examples, the dimension 222 of the P-wells 202 and N-well 204 may be between about 60 to 80 nanometers. In other examples, the dimension 222 of the P-wells 202 and N-well 204 may be about 70 nanometers.

In various embodiments of the IC device 200, along the z-axis, the dimension 228 of the recesses 230 and 232 (e.g., the distance into the respective P-wells 202 and N-wells 204) may be between about 40% and 60% of the dimension 222 of the P-wells 202 and N-well 204. In some examples, the dimension 226 of the recesses 234 (e.g., the distance into the respective P-wells 202 and/or N-wells 204) may be less than 30% or less than 20% of the dimension 222 of the P-wells 202 and N-well 204. In other examples, the dimension 226 of the recesses 234 can be close to 0%. Alternatively, the subfin portion 201 may include a recess (e.g., the recesses 230 and/or 232) between a nearest-neighbor pair of gate stacks 208 at which one of the P-type structures 210 or one of the N-type structures 212 is located but may not include any recess (e.g., the recesses 234) between a nearest-neighbor pair of gate stacks 208 at which none of the P-type structures 210 or N-type structures 212 is located.

In various embodiments of the IC device 200, the depth or dimension 228 of the recesses 230 and 232 and/or the depth or dimension 226 of the recesses 234 between a respective pair of nearest-neighbor pair of gate stacks 208 may be dependent on the space between the respective pair of nearest-neighbor pair of gate stacks 208. Stated differently, the space between a pair of nearest-neighbor pair of gate stacks 208 may modulate the depth (e.g., an etch depth) or dimension 228 of the recesses 230 and 232 and/or the depth (e.g., an etch depth) or dimensions 226 of the recesses 234 therebetween. In this regard, a wider space (e.g., a distance 216) between a pair of nearest-neighbor pair of gate stacks 208 may yield a deeper recess (or etch) therebetween. Conversely, a narrower space (e.g., a distance 218) between a pair of nearest-neighbor pair of gate stacks 208 may yield a shallower recess (or etch) therebetween. For instance, in some embodiments, the distance 216 between a nearest-neighbor pair of gate stacks 208 with one of the P-type doped structures 210 or one of the N-type doped structures 212 therebetween is between about 38 nanometers and 42 nanometers (or between 35 nanometers and 45 nanometers); and the distance 218 between a nearest-neighbor pair of gate stacks 208 with none of the P-type doped structures 210 or N-type doped structures 212 therebetween is between about 30 nanometers and 35 nanometers (or between 25 nanometers and 40 nanometers). In various embodiments of the IC device 200, the distance 216 may be between about 103% and 130% (e.g., between about 105% and 120%) of a distance between a nearest-neighbor pair of gate stacks 208 with one of the P-type doped structures 210 or one of the N-type doped structures 212 therebetween for transistors; the distance 218 may be between about 75% and 98% (e.g., between about 83% and 97%) of a distance between a nearest-neighbor pair of gate stacks 208 with none of the P-type doped structures 210 or N-type doped structures 212 therebetween for transistors. In some examples, the distance 216 between the nearest-neighbor pair of two of the gate stacks 208 with one of the P-type doped structures 210 or one of the N-type doped structures 212 therebetween is between 105% and 150% (or between 110% and 140%) of the distance 218 between the nearest-neighbor pair of two of the gate stacks 208 with none of the P-type doped structures 210 or N-type doped structures 212 therebetween.

As discussed above, a separate stack of nanoribbons 206 may be over each of the P-well 202 or N-well 204. In various embodiments of the IC device 200, along the y-axis, a distance 219 between a stack of nanoribbons 206 over a P-well 202 and a stack of nanoribbons 206 over an immediate adjacent N-ell 204 may be between about 8 nanometers and 18 nanometers (or between 10 nanometers and 16 nanometers). In some examples, the distance 219 between a stack of nanoribbons 206 over a P-well 202 and a stack of nanoribbons 206 over an immediate adjacent N-well 204 may be between about 20% and 50% (or between about 30% and 45%) of the distance 218 between a nearest-neighbor pair of gate stacks 208 with none of the P-type doped structures 210 or N-type doped structures 212 therebetween.

In various embodiments of the IC device 200, a subfin diode (e.g., the subfin diodes 240 and 242) may be formed from a P-well 202 and an adjacent N-well 204 (e.g., a PN junction) in the subfin portion 201. One terminal (e.g., an anode) of the diode may be formed from the P-type doped structures 210 that extend from the respective P-well 202, where each of the P-type doped structures 210 may have one end enclosed by the respective P-well 202 and an opposite end with a conductive contact 214 over it. In a similar way, another terminal (e.g., cathode) of the diode may be formed from the N-type-doped structures 212 that extend from the respective N-well 204, where each of the N-type doped structures 212 may have one end enclosed by the respective N-well 204 and an opposite end with a conductive contact 214 over it. In general, an IC device with K number of alternating P-wells and N-wells can form up to (K-1) number of subfin diodes.

In the illustrated example of FIG. 2, two PN junctions can be formed in the IC device 200. Accordingly, the IC device 200 may include two subfin diodes 240 and 242. For instance, the subfin diode 240 may be formed from the P-well 202 on the left side of FIG. 2 and the N-well 204 (adjacent to and in contact with the respective P-well 202). The conductive contacts 214 of the P-type doped structures 210 that extend from the respective P-well 202 may be electrically connected together to form one terminal (e.g., an anode) of the diode 240 and the conductive contacts 214 over the N-type structures 212 extending from the respective N-well 204 may be electrically connected together to form another terminal (e.g., a cathode) of the diode 240. As such, a current path for the subfin diode 240 may traverse from one terminal of the diode 240 across the adjacent pair of P-well 202 and N-well 204 (e.g., PN junction) to the other terminal of the diode 240. The subfin diode 242 may be formed from the N-well 204 and the adjacent P-well 202 on the right side of FIG. 2, and the terminals of the subfin diode 242 may be formed similar to the subfin diode 240. In various embodiments of the IC device 200, the increased Si cross-section provided by the deeper (e.g., in a dimension along the z-axis) recesses 230 and 232 at which the P-types structures 210 and N-type structures 212 are located can advantageously improve the conductivity of the diodes 240 and 242. Further, the increased Si retention provided by the shallower (e.g., in a dimension along the z-axis) recesses 234 (at which none of the P-type structures 210 or N-type structures 212 is formed) between the terminals of a diode 240 or 242 can advantageously improve the current carry capability of the diodes 240 and 242.

Figures 3A, 3B, 3C:
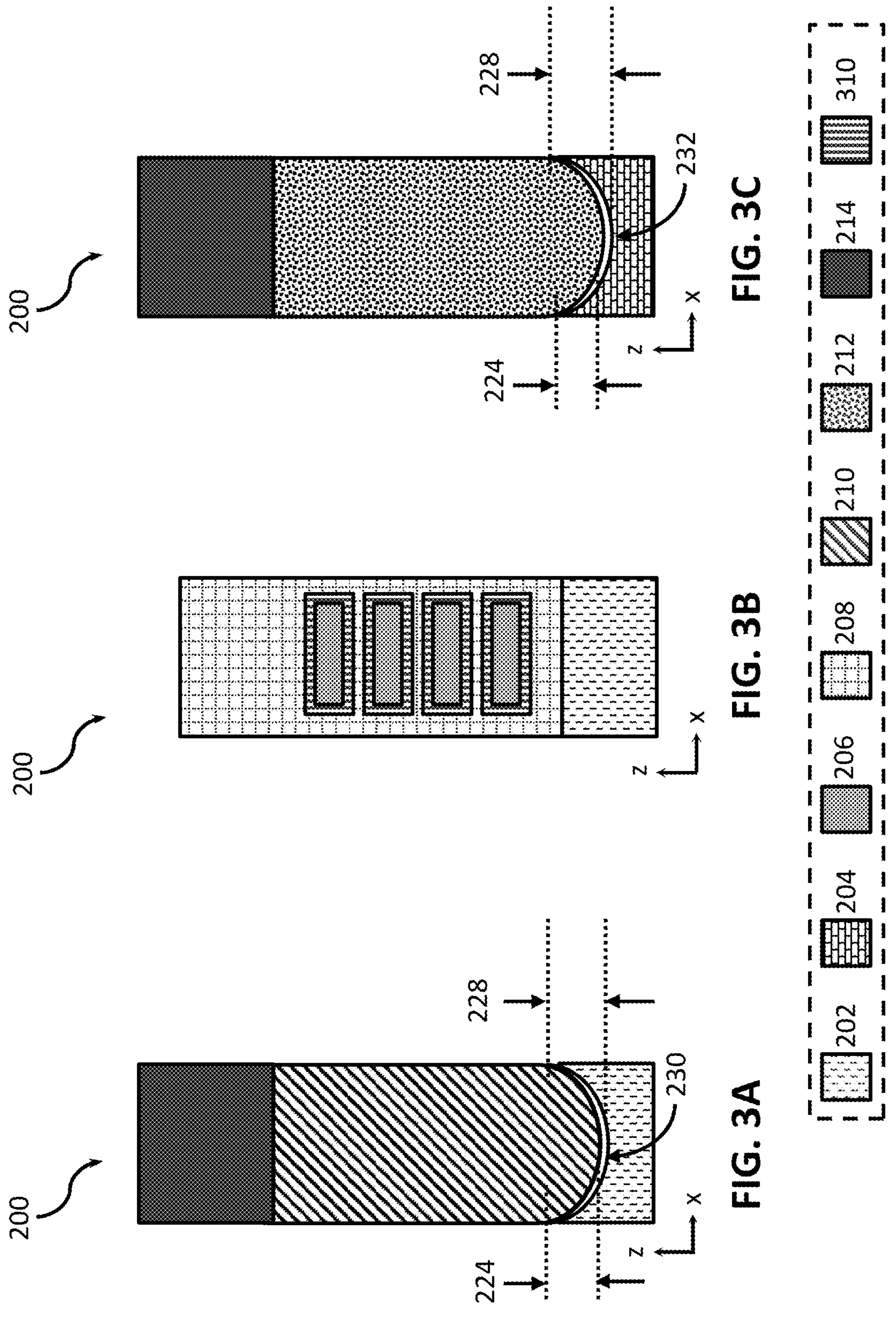
FIGS. 3A-3C are transverse cross-sectional side views of an IC device with example subfin diodes, according to some embodiments of the disclosure.

FIGS. 3A-3C are transverse cross-sectional side views of one example of the IC device 200 shown in FIG. 2. Thus, descriptions provided with respect to FIG. 1 are applicable to FIGS. 3A-3C and, therefore, in the interests of brevity, are not repeated. The cross-sectional side view of FIG. 3A is the view in the x-z plane of the example coordinate system shown in FIG. 1 with the cross section taken along one of the P-type doped structures 210 (e.g., along the plane shown in FIG. 2 as a plane AA). The cross-sectional side view of FIG. 3B is the view in the x-z plane of the example coordinate system shown in FIG. 1 with the cross section taken along one of the gate stacks 208 (e.g., along the plane shown in FIG. 2 as a plane BB). The cross-sectional side view of FIG. 3C is the view in the x-z plane of the example coordinate system shown in FIG. 1 with the cross section taken along one of the N-type doped structures 212 (e.g., along the plane shown in FIG. 2 as a plane CC). A legend provided within a dashed box at the bottom of FIG. 3 illustrates colors/patterns used to indicate some portions or materials of some of the elements shown in FIG. 3, so that FIG. 3 is not cluttered by too many reference numerals. For example, FIG. 2 uses different colors/patterns to illustrate P-wells 202, an N-well 204, nanoribbons 206, gate stacks 208, P-type doped structures 210, N-type doped structure 212, contacts 214, and gate dielectric material 310.

As explained above, the P-type doped structure 210*s* of the IC device 200 may extend through each of the nanoribbons 206 along the z-axis. Accordingly, the transverse cross-sectional view of the P-type doped structure 210 along the plane AA in FIG. 3A shows the P-type doped structure 210 extending between the electrical contact 214 and the respective P-well 202. As further shown, a portion of the P-type doped structure 210 with a dimension 224 along the z-axis may be enclosed within the P-well 202 at which the recess 230 is located, and the recess 230 may have a dimension 228 along the z-axis as discussed above with reference to FIG. 2.

As shown in FIG. 3B, a gate dielectric material 310 may wrap around each nanoribbon 206 in the stack of nanoribbons 206. The gate dielectric material 310 may be similar to the gate dielectric material 112 discussed above with reference to FIG. 1. The gate stack 208 may extend vertically, along the z-axis, away from a respective P-well 202 and wraps around the gate dielectric material 310. In general, the gate dielectric material 310 may wrap around at least a portion the nanoribbons 206. In some examples, the gate dielectric material 310 can be optional.

As explained above, the N-type doped structures 212 of the IC device 200 may extend through each of the nanoribbons 206 along the z-axis. Accordingly, the transverse cross-sectional view of the N-type doped structure 212 along the plane AA in FIG. 3C shows the N-type doped structure 212 extending between the respective electrical contact 214 and the respective N-well 204. As further shown in FIG. 3C, a portion of the N-type doped structure 212 with a dimension 224 along the z-axis may be enclosed within the N-well 204 at which the recess 232 is located, and the recess 232 may have a dimension 228 along the z-axis as discussed above with reference to FIG. 2.

Figure 4:
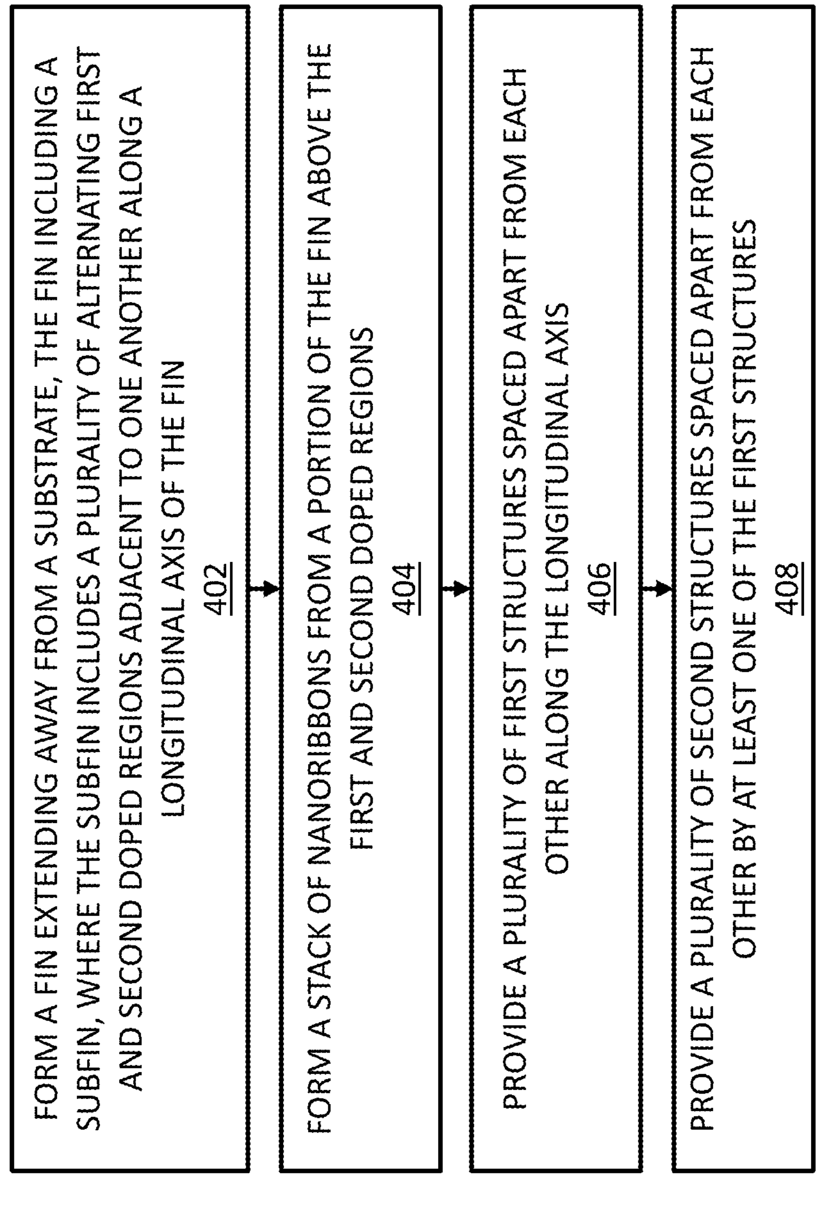
FIG. 4 is a flow diagram of an example method of manufacturing an IC device with subfin diodes, according to some embodiments of the disclosure.

FIG. 4 is a flow diagram of an example method 400 of manufacturing an IC device with subfin diodes, according to some embodiments of the disclosure.

Although the operations of the method 400 are illustrated once each and in a particular order, the operations may be performed in any suitable order and repeated as desired. For example, one or more operations may be performed in parallel to manufacture, substantially simultaneously, subfin diodes as described herein. In another example, the operations may be performed in a different order to reflect the structure of a particular device assembly in which one or more subfin diodes as described herein will be included.

In addition, the example manufacturing method 400 may include other operations not specifically shown in FIG. 4, such as various cleaning or planarization operations as known in the art. For example, in some embodiments, the support structure 101, as well as layers of various other materials subsequently deposited thereon, may be cleaned prior to, after, or during any of the processes of the method 400 described herein, e.g., to remove oxides, surface-bound organic and metallic contaminants, as well as subsurface contamination. In some embodiments, cleaning may be carried out using e.g., chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the diodes structures/assemblies described herein may be planarized prior to, after, or during any of the processes of the method 400 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

In various embodiments, any of the processes of the method 400 may include any suitable patterning techniques, such as photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in the method 400 may include an anisotropic etch, using etchants in a form of e.g., chemically active ionized gas (i.e., plasma) using e.g., bromine (Br) and chloride (CI) based chemistries. In some embodiments, during any of the etches of the method 400, the IC structure may be heated to elevated temperatures, e.g., to temperatures between about room temperature and 200 degrees Celsius, including all values and ranges therein, to promote that byproducts of the etch are made sufficiently volatile to be removed from the surface.

The method 400 may begin with forming a fin extending away from a substrate (process 402 shown in FIG. 4). The fin may include a subfin. The subfin (e.g., the subfin 201) may include a plurality of alternating first and second doped regions adjacent to one another along a longitudinal axis of the fin. The first and second doped regions being regions of one or more semiconductor materials with different types of dopants. In some examples, the dopants of the first doped regions may be P-type dopants and the dopants of the second doped regions may be N-type dopants. For instance, the first doped regions may be similar to the P-wells 202, and the second doped regions may be similar to the N-well 204 discussed above with reference to FIG. 2. In other examples, the dopants of the first doped regions are N-type dopants and the dopants of the second doped regions are P-type dopants. For instance, the first doped region may be similar to the N-well 204, and the second doped regions may be similar to the P-wells 202 discussed above with reference to FIG. 2.

The method 400 may form a stack of nanoribbons from a portion of the fin above the first and second doped regions (process 404 shown in FIG. 4). The nanoribbons may extend horizontally along the longitudinal axis and stack vertically along an axis about perpendicular to the longitudinal axis (e.g., and about perpendicular to the substrate).

The method 400 may provide a plurality of first structures (e.g., the gate stacks 208) spaced apart from each other along the longitudinal axis of electrically conductive material or gate electrode material (process 406 shown in FIG. 4). An individual first structure (or each of the first structures) may extend vertically away from one of the first and second doped regions and includes an electrically conductive material at least partially wrapping around the nanoribbons of the stack. The process 406 may utilize any suitable process to provide the first structures, for example, including deposition, photolithography patterning, and etching processes. The deposition of a suitable gate material to form a gate electrode layer may include chemical vapor deposition (CVD), physical vapor deposition (PVD), atomic layer deposition (ALD), molecular beam epitaxy (MBE), high density plasma CVD (HDPCVD), metal organic CVD (MOCVD), remote plasma CVD (RPCVD), plasma enhanced CVD (PECVD), plating, any other suitable processes, and/or combinations thereof. Further, in some embodiments, a gate dielectric layer may be further disposed (or formed) between the first structures and the nanoribbons as discussed above with reference to FIG. 1 and FIG. 3B by any suitable processes.

The method 400 may provide a plurality of second structures (e.g., the P-type doped structures 210 the N-type doped structures 212) spaced apart from each other by at least one of the first structures (process 408 shown in FIG. 4). An individual second structure (or each of the second structures) may extend vertically away from one of the first and second doped regions and includes a semiconductor material extending through each of the nanoribbons of the stack. In some embodiments, each of the second structures may at least partially wraps around each of the nanoribbons in the stack. In other embodiments, each of the second structures may extend through each of the nanoribbons in the stack. In general, the second structures can at least wrap around each of the nanoribbons in the stack and/or extend through each of the nanoribbons. In some embodiments, the process 408 may include epitaxially growing the second structures as discussed above with reference to FIG. 2. In general, the process 410 may use any suitable process, for example, ion implantation, photolithography patterning, and etching processes.

In some embodiments, a distance (e.g., the distance 216) between a nearest-neighbor pair of two of the first structures with one of the second structures therebetween is greater than a distance (e.g., the distance 218) between a nearest-neighbor pair of two of the first structures with none of the second structures therebetween.

In some embodiments, prior to providing the second structures at 408, the method 400 may further perform an etch to form recesses in the first and second doped regions and provide the second structures so that a portion of an individual second structure is within a respective one of the recesses, where a depth of a recess in a portion of the subfin where a pair of first and second doped regions interfaces is smaller than depth of the recesses in the first and second doped regions.

Any of the IC devices with subfin diodes may be used to implement any suitable components. For example, in various embodiments, IC devices with subfin diodes as described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

IC devices with subfin diodes as disclosed herein may be included in any suitable electronic device. FIGS. 5-9 illustrate various examples of devices and components that may include at least one IC device with one or more subfin diodes as disclosed herein.

Figure 5:
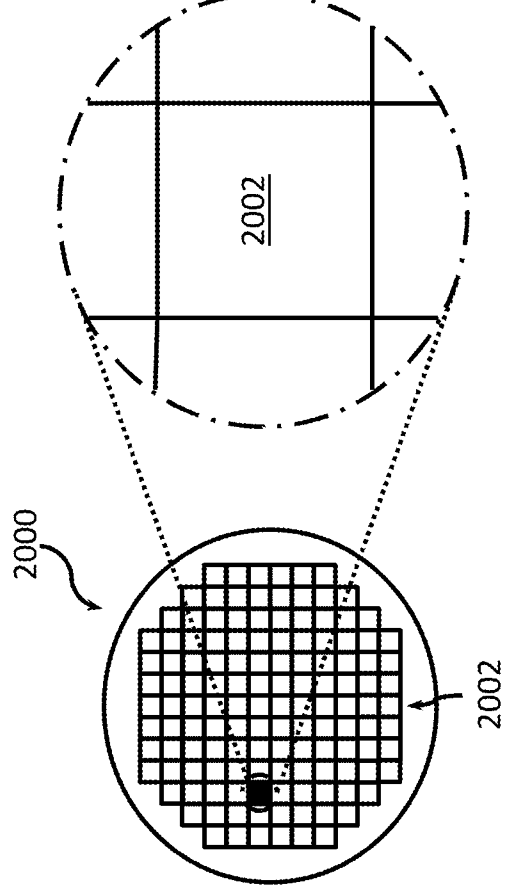
FIG. 5 illustrates top views of a wafer and dies that include one or more subfin diodes in accordance with any of the embodiments of the present disclosure.

FIG. 5 illustrates top views of a wafer 2000 and dies 2002 that may include one or more IC devices with subfin diodes in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., IC devices including at least one subfin diode as described herein). After the fabrication of the semiconductor product is complete (e.g., after manufacture of at least one subfin diode as described herein, e.g., after manufacture of any embodiment of the IC devices shown in FIGS. 1-3, or any further embodiments of these devices, described herein), the wafer 2000 may undergo a singulation process in which each of the dies 2002 is separated from one another to provide discrete "chips" of the semiconductor product. In particular, IC devices with subfin diodes as disclosed herein may take the form of the wafer 2000 (e.g., not singulated) or the form of the die 2002 (e.g., singulated). The die 2002 may include at least one subfin diode (e.g., one or more subfin diodes 240 and/or 242 as described herein), as well as, optionally, supporting circuitry to route electrical signals to the at least one subfin diode, as well as any other IC components. In some embodiments, the wafer 2000 or the die 2002 may implement an RF FE device, a memory device (e.g., a static random access memory (SRAM) device), a logic device (e.g., an AND, OR, NAND, or NOR gate), or any other suitable circuit element. Multiple ones of these devices may be combined on a single die 2002.

Figure 6:
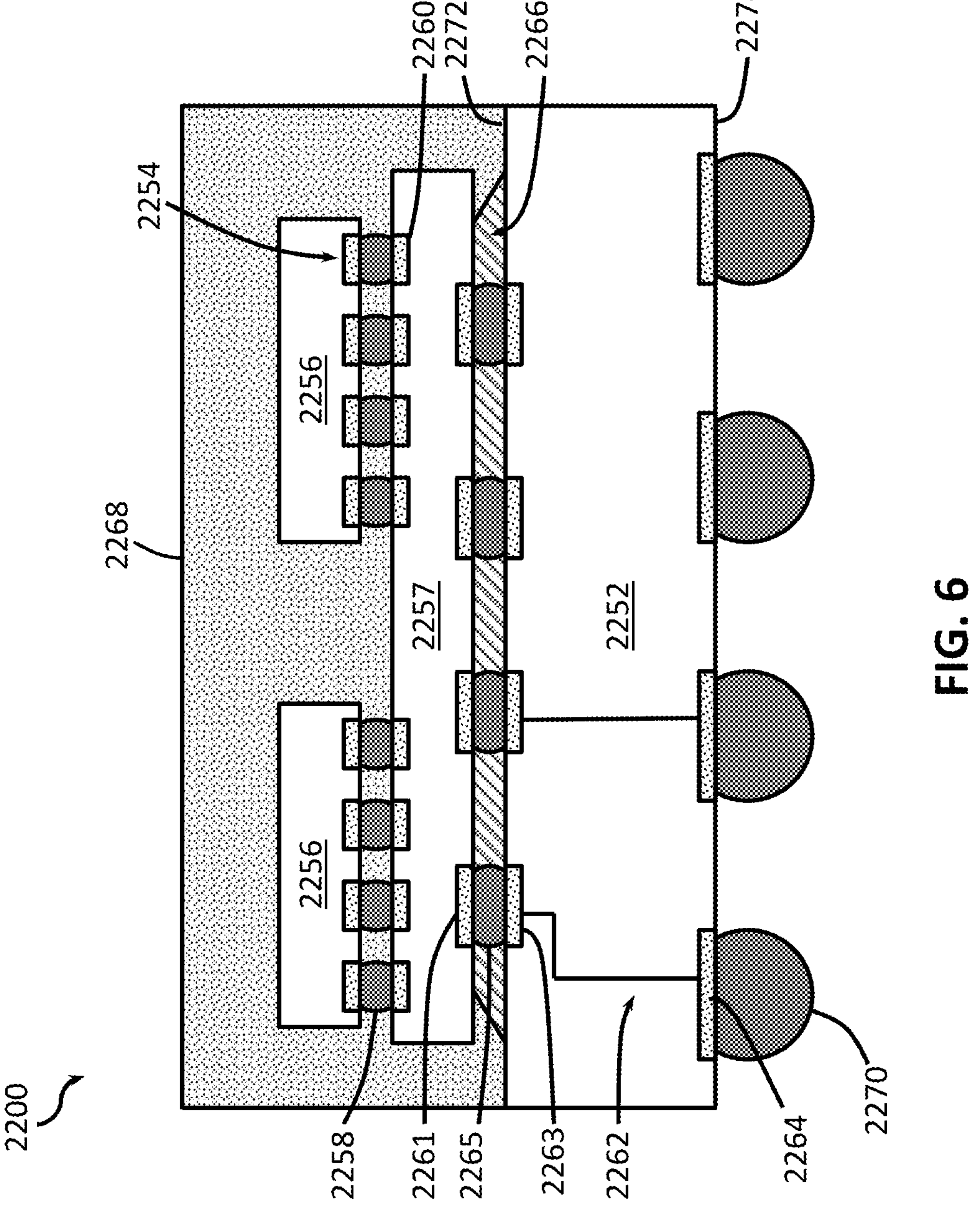
FIG. 6 is a cross-sectional side view of an IC package that may include one or more IC devices with subfin diodes in accordance with any of the embodiments of the present disclosure.

FIG. 6 is a side, cross-sectional view of an example IC package 2200 that may include one or more IC devices with subfin diodes in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC device having at least one subfin diode, e.g., any of the IC devices shown in FIGS. 1-3, or any further embodiments of at least one subfin diode, described herein. In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be RF FE dies and/or logic dies, including at least one subfin diode as described herein, one or more of the dies 2256 may be memory dies (e.g., high bandwidth memory), etc. In some embodiments, any of the dies 2256 may include at least subfin diode, e.g., as discussed above; in some embodiments, at least some of the dies 2256 may not include any subfin diode.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
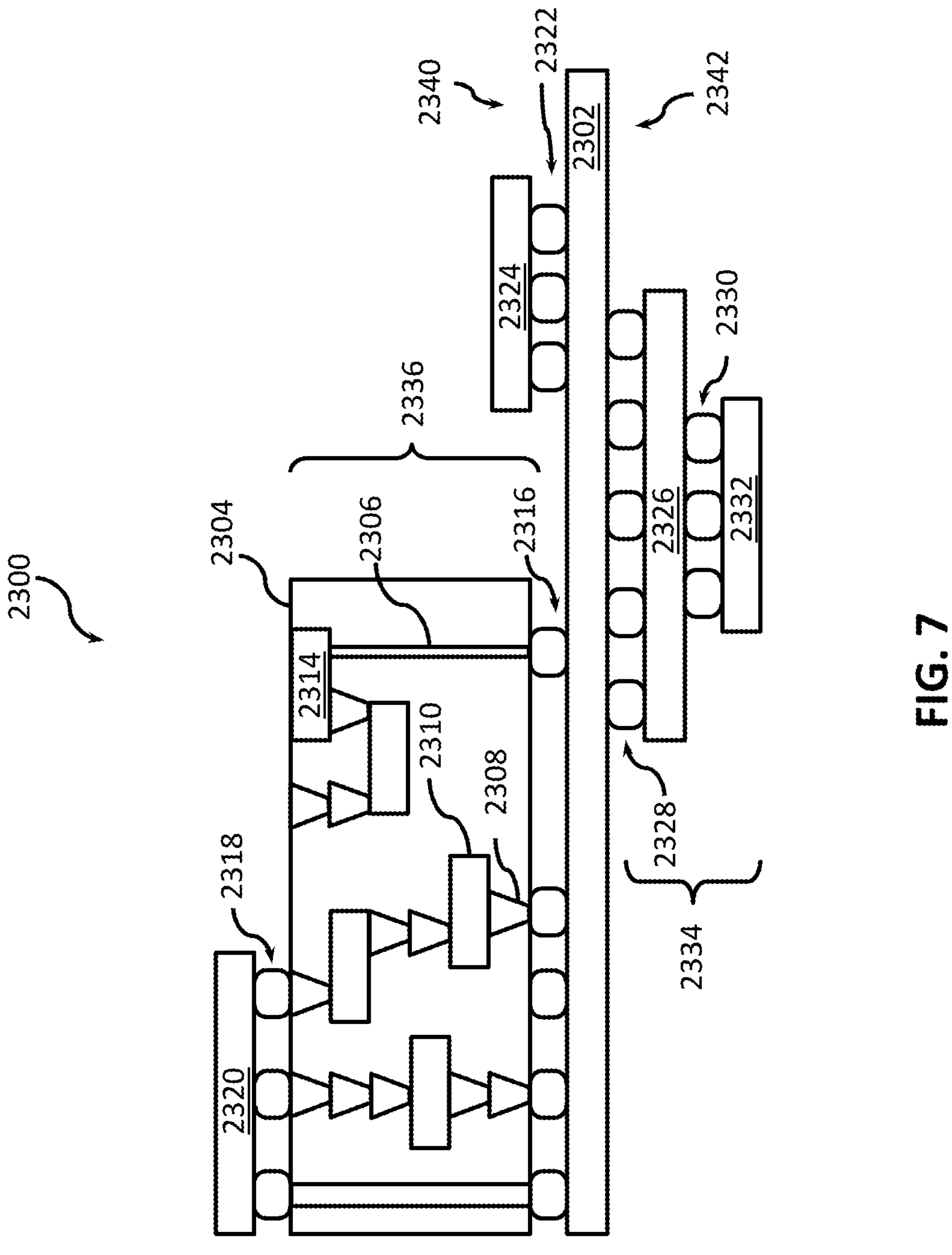
FIG. 7 is a cross-sectional side view of an IC device assembly that may include one or more IC devices with subfin diodes in accordance with any of the embodiments of the present disclosure.

FIG. 7 is a cross-sectional side view of an IC device assembly 2300 that may include components having one or more IC devices implementing at least one subfin diode in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing at least one subfin diode in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include at least one subfin diode in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC device of FIGS. 1-3), or any other suitable component. In particular, the IC package 2320 may include at least one subfin diode as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing at least one subfin diode as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
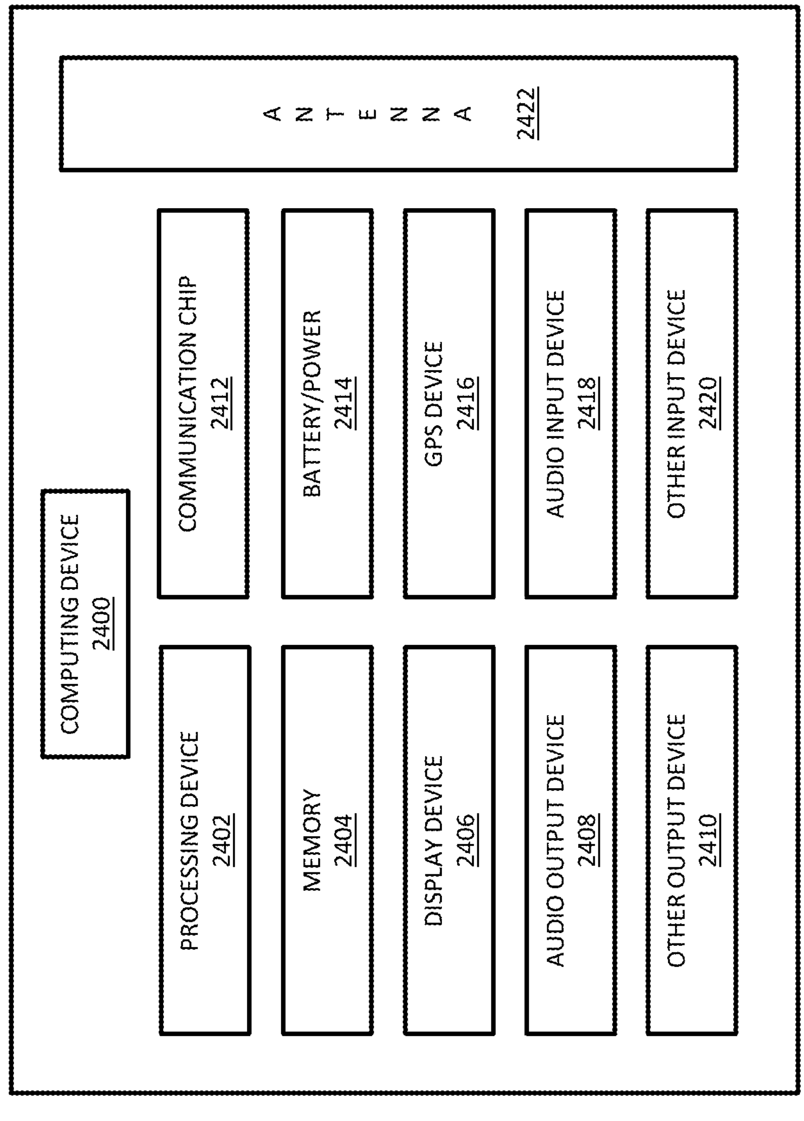
FIG. 8 is a block diagram of an example computing device that may include one or more IC devices with subfin diodes in accordance with any of the embodiments of the present disclosure.

FIG. 8 is a block diagram of an example computing device 2400 that may include one or more components with one or more IC devices having at least one subfin diode in accordance with any of the embodiments disclosed herein. For example, any suitable ones of the components of the computing device 2400 may include a die (e.g., the die 2002 (FIG. 5B)) including at least one subfin diode in accordance with any of the embodiments disclosed herein. Any of the components of the computing device 2400 may include an IC device (e.g., any embodiment of the IC device of FIGS. 1-3) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices with at least one subfin diode as described herein may be particularly advantageous for use within the one or more communication chips 2412, described above. For example, such IC devices with at least one subfin diode may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include another output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include another input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
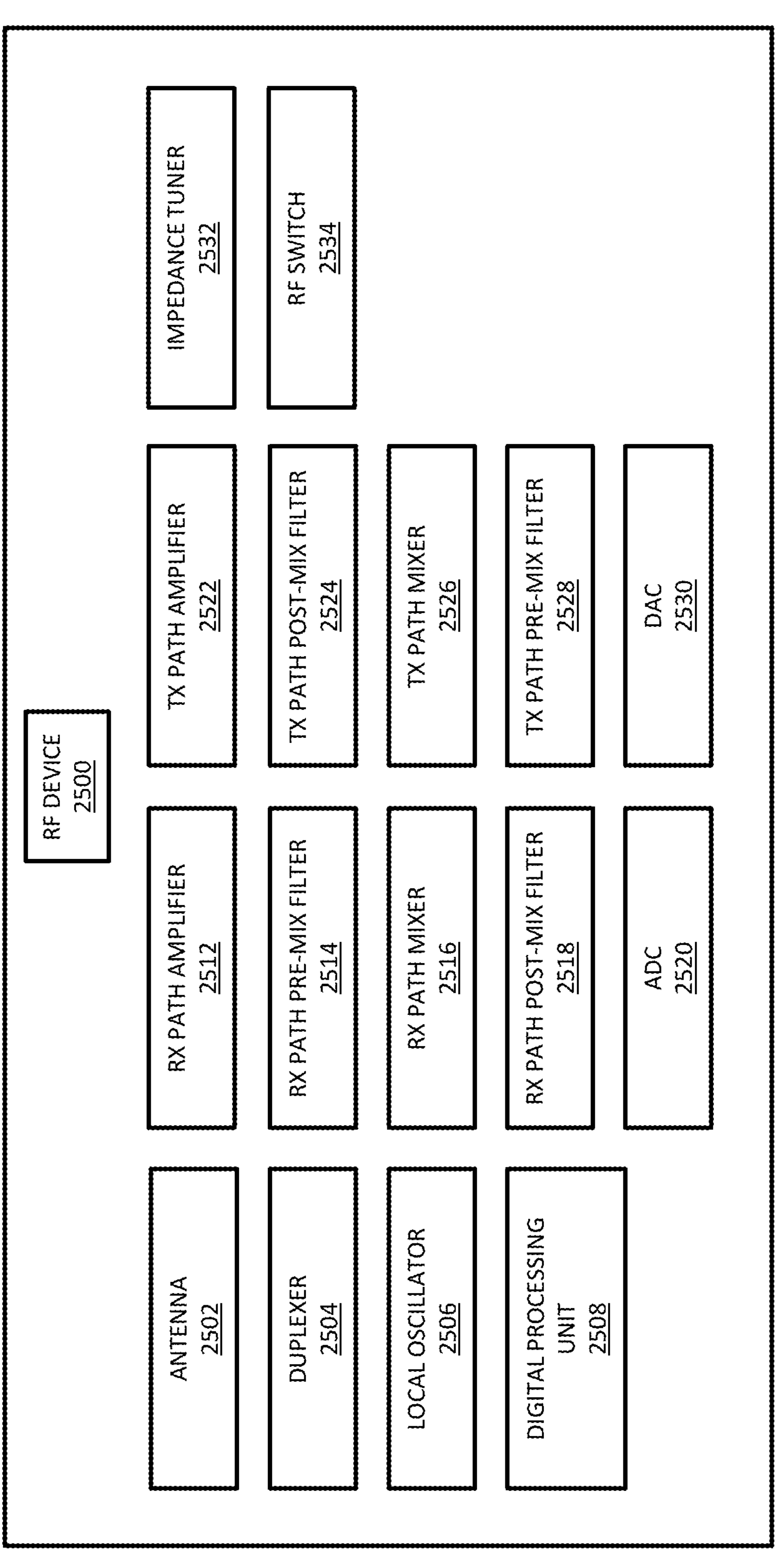
FIG. 9 is a block diagram of an example radio frequency (RF) device that may include one or more IC devices with subfin diodes in accordance with any of the embodiments of the present disclosure.

FIG. 9 is a block diagram of an example RF device 2500 that may include one or more components with one or more IC devices having at least one subfin diode in accordance with any of the embodiments disclosed herein. For example, any suitable ones of the components of the RF device 2500 may include a die (e.g., the die 2002 as described with reference to FIG. 7 or a die implementing the IC device as described with reference to FIGS. 1-3) including at least one subfin diode in accordance with any of the embodiments disclosed herein. Any of the components of the RF device 2500 may include an IC device (e.g., the IC device of FIGS. 1-3) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 9, such as, but not limited to, the battery/power circuit 2414, the memory 2404, and various input and output devices as shown in FIG. 9.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path which may include a TX path amplifier 2522, a TX path post-mix filter 2524, a TX path mixer 2526, a TX path pre-mix filter 2528, and a digital-to-analog converter (DAC)

2530. Still further, the RF device 2500 may further include an impedance tuner 2532 and an RF switch 2534. In various embodiments, the RF device 2500 may include multiple instances of any of the components shown in FIG. 9. The RX path amplifier 2512, the TX path amplifier 2522, the duplexer 2504, and the RF switch 2534 may be considered to form, or be a part of, an RF FE of the RF device 2500. The RX path mixer 2516 and the TX path mixer 2526 (possibly with their associated pre-mix and post-mix filters shown in FIG. 9) may be considered to form, or be a part of, an RF transceiver of the RF device 2500 (or of an RF receiver or an RF transmitter if only RX path or TX path components, respectively, are included in the RF device 2500).

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC devices as described herein, e.g., IC devices having at least one subfin diode in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 9, configured to cooperate with the digital processing unit 2508. When used within, or coupled to, the RF device 2500, the memory device 2404 may, but does not have to, implement any of the IC devices as described herein, e.g., IC devices having at least one subfin diode in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be, e.g., a harmonic or band-pass filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the downconverter 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a low-pass filter (or a pair of filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 9, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, IC devices including one or more subfin diodes as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable PLL, configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

The following paragraphs provide various examples of the embodiments disclosed herein.

Example 1 provides an integrated circuit (IC) device, including an elongated semiconductor structure including a plurality of alternating first and second doped regions (e.g., N-wells and P-wells) adjacent to (e.g., in contact with) one another along an axis, the first and second doped regions being regions of one or more semiconductor materials with different types of dopants (e.g., first doped regions are P-type doped regions and second doped regions are N-type doped regions, or vice versa); a stack of horizontal nanoribbons over the first and second doped regions; a plurality of first structures (e.g., gate electrodes) spaced apart from each other along the axis, where an individual first structure extends vertically away from one of the first and second doped regions and includes an electrically conductive material (e.g., a metal or any suitable materials typically used as gate electrode materials) at least partially wrapping around the nanoribbons of the stack; and a plurality of second structures (e.g., p-epi and/or n-epi) spaced apart from each other by at least one of the first structures, where an individual second structure extends vertically away from one of the first and second doped regions and includes a semiconductor material at least partially wrapping around or extending through each of the nanoribbons of the stack and, where a distance between a nearest-neighbor pair of two of the first structures with one of the second structures therebetween is greater than a distance between a nearest-neighbor pair of two of the first structures with none of the second structures therebetween.

Example 2 provides the IC device according to example 1, where the individual second structure includes a portion enclosed by the one of the first and second doped regions (i.e., the second structures extend into, or below the surface of, the respective ones of the first and second doped regions).

Example 3 provides the IC device according to any one of examples 1-2, where the axis is a first axis, along a second axis, a dimension of the portion of the individual second structure enclosed by the one of the first and second doped regions is between 20% and 80% of a dimension of the one of the first and second doped regions (e.g., between about 30% and 70%, or between about 40% and 60%), and the second axis is perpendicular to the first axis (the second axis is also perpendicular to a support structure (e.g., a die, a substrate, a chip, etc.) over which the IC device is provided, and the second axis is an axis along which the nanoribbons of the stack are stacked).

Example 4 provides the IC device according to any one of examples 1-3, where a distance between the nearest-neighbor pair of two of the first structures with one of the second structures therebetween is between 110% and 140% of a distance between the nearest-neighbor pair of two of the first structures with none of the second structures therebetween.

Example 5 provides the IC device according to any one of examples 1-4, where one of the nearest-neighbor pair of two of the first structures with none of the second structures therebetween extends away from one of the first doped regions, another one of the nearest-neighbor pair of two of the first structures with none of the second structures therebetween extends away from one of the second doped regions, and the one of the second doped regions is adjacent to (e.g., in contact with) the one of the first doped regions.

Example 6 provides the IC device according to any one of the examples 1-5, where a recess is in at least one of the first doped regions or one of the second doped regions adjacent to the one of the first doped regions and between the nearest-neighbor pair of two of the first structures with none of the second structures therebetween, and along the second axis, a dimension of the recess is less than 30% of the dimension of the one of the first and second doped regions (e.g., between about 10% and 20%).

Example 7 provides the IC device according to any one of the examples 1-6, where the stack of nanoribbons includes a first stack of nanoribbons over one of the first doped regions, and a second stack of nanoribbons over one of the second doped regions adjacent to the one of the first doped regions.

Example 8 provides the IC device according to any one of the examples 1-7, where the semiconductor material of one of the second structures extending away from one of the first doped regions includes one of P-type dopants or N-type dopants, and the semiconductor material of one of the second structures extending away from one of the second doped regions includes another one of P-type dopants or N-type dopants.

Example 9 provides the IC device according to any one of examples 1-8, where a dopant concentration of the semiconductor material of the second structures is at least $10^{19}$ dopants per square centimeter, e.g., at least $10^{20}$ dopants per square centimeter or at least $10^{21}$ dopants per square centimeter.

Example 10 provides the IC device according to any one of examples 1-9, where a dopant concentration of the one or more semiconductor materials of the first and second doped regions is at least $10^{16}$ dopants per square centimeter, e.g., at least $10^{17}$ dopants per square centimeter or at least $10^{18}$ dopants per square centimeter.

Example 11 provides the IC device according to any one of examples 1-10, where the dopants of the first doped regions are one of P-type dopants or N-type dopants and the dopants of the second doped regions are another one of P-type dopants or N-type dopants.

Example 12 provides the IC device according to any one of examples 1-11, where a dimension of each of the plurality of alternating first and second doped regions along the second axis is about 50 to 150 nanometers.

Example 13 provides the IC device according to any one of examples 1-12, further including a support structure; and an insulator material enclosing sidewalls of the elongated semiconductor structure, where the elongated semiconductor structure extends away from the support structure, and where a dimension of the elongated semiconductor structure along the first axis is larger than a dimension of the elongated semiconductor structure in a plane perpendicular to the first axis and along an axis parallel to the support structure.

Example 14 provides the IC device according to any one of examples 1-13, further including a support structure, where the plurality of alternating first and second doped regions are over the support structure, and a dopant concentration of one of the first and second doped regions is greater than a dopant concentration of the support structure.

Example 15 provides the IC device according to any one of examples 1-14, where the nanoribbons in the stack include one or more semiconductor materials.

Example 16 provides an integrated circuit (IC) device, including a subfin structure including a first doped well and a second doped well (e.g., a P-well and an N-well) adjacent to one another along a first axis; an insulator structure enclosing sidewalls of the subfin structure along the first axis; a first structure (e.g., one of n-epi or p-epi) extending along a second axis away from the first doped well, the second axis being perpendicular to the first axis; and a second structure (e.g., the other one of n-epi or p-epi) extending along the second axis away from the second doped well; where one of the first doped well and the second doped well includes a semiconductor material with P-type dopants, another one of the first doped well and the second doped well includes a semiconductor material with N-type dopants, a first recess extends along the second axis into the first doped well to a first distance, a second recess extends along the second axis into the second doped well to a second distance, a third recess extends along the second axis into at least one of the first doped well or the second doped well to a third distance shorter (e.g., a shallower depth) than the first distance and the second distance, a portion of the first structure is within the first recess, and a portion of the second structure is within the second recess.

Example 17 provides the IC device according to example 16, further including a first stack of nanoribbons over the first doped well; and a second stack of nanoribbons over the second doped well, the second stack being separate from the first stack; where the first structure includes a semiconductor material at least partially wrapping around or extending through the nanoribbons of the first stack, and the second structure includes a semiconductor material at least partially wrapping around or extending through the nanoribbons of the second stack.

Example 18 provides the IC device according to any one of examples 16-17, where the first distance into the first doped well which the first recess extends is between about 40% and 60% of a dimension of the first and second doped wells along the second axis.

Example 19 provides the IC device according to any one of examples 16-18, where the second distance into the first doped well which the second recess extends is between about 40% and 60% of a dimension of the first and second doped wells along the second axis.

Example 20 provides the IC device according to any one of examples 16-19, where the third distance into the first and second doped wells which the third recess extends is less than 20% of a dimension of the first and second doped wells along the second axis.

Example 21 provides the IC device according to any one of examples 16-20, where a dimension of at least one of the first doped well or the second doped well along the second axis is about 70 nanometers.

Example 22 provides the IC device according to any one of examples 16-21, further including a plurality of third structures extending along the second axis away from the first doped well and the second doped well, the plurality of third structures including an electrically conductive material; where the first structure and the second structure are spaced apart from each other by one or more of the plurality of third structures.

Example 23 provides the IC device according to any one of examples 16-22, where along the first axis, a distance between the first stack of nanoribbons and the second stack of nanoribbons is between 30% and 45% of a distance between a nearest-neighbor pair of two of the third structures with none of the first or second structures therebetween.

Example 24. An integrated circuit (IC) device, including a support structure; a first doped region and an adjacent second doped region extending along a first axis over the support structure, the first and second doped regions being regions of one or more semiconductor materials with different types of dopants; a plurality of first structures extending along a second axis away from the first and second doped regions and spaced apart from each other, where an individual first structure includes an electrically conductive material (e.g., a metal or any suitable materials typically used as gate electrode materials); and a plurality of second structures extending along the second axis away from the first and second doped regions, where an individual second structure between a nearest-neighbor pair of two of the first structures includes a semiconductor material and a portion enclosed by the first doped region or the second doped region, and along the second axis, a dimension of the enclosed portion is between about 30% to 70% of a dimension of the first and second doped regions.

Example 25 provides the IC device according to example 24, where a distance between the nearest-neighbor pair of two of the first structures having the individual second structure therebetween is greater than a distance between a nearest-neighbor pair of two of the first structures having none of the second structures therebetween.

Example 26 provides the IC device according to any one of examples 24-25, where a recess at an interface between the first and second doped regions extends along the second axis into the first and second doped regions to a distance between about 10% and 20% of a dimension of the first and second doped regions along the second axis.

Example 27 provides the IC device according to any one of examples 24-26, further including a stack of nanoribbons over the first and second doped regions, where the electrically conductive material of the individual first structure wraps around at least a portion of each of the nanoribbons in the stack; and the semiconductor material of the individual second structure extends through each of the nanoribbons in the stack.

Example 28 provides the IC device according to any one of examples 24-27, where the dopants of one of the first doped region or the second doped regions are P-type dopants and the dopants of the other one of the first doped region or the second doped regions are N-type dopants.

Example 29 provides the IC device according to any one of examples 24-28, where a dimension of the first and second doped regions along the second axis is about 70 nanometers.

Example 30 provides a method for fabricating a transistor arrangement, the method including forming a fin extending away from a substrate, the fin including a subfin, where the subfin includes a plurality of alternating first and second doped regions adjacent to one another along a longitudinal axis of the fin, the first and second doped regions being regions of one or more semiconductor materials with different types of dopants; forming a stack of nanoribbons from a portion of the fin above the first and second doped regions; providing a plurality of first structures spaced apart from each other along the longitudinal axis, where an individual first structure extends vertically away from one of the first and second doped regions and includes an electrically conductive material at least partially wrapping around the nanoribbons of the stack; and providing a plurality of second structures spaced apart from each other by at least one of the first structures, where an individual second structure extends vertically away from one of the first and second doped regions and includes a semiconductor material extending through each of the nanoribbons of the stack, where a distance between a nearest-neighbor pair of two of the first structures with one of the second structures therebetween is greater than a distance between a nearest-neighbor pair of two of the first structures with none of the second structures therebetween.

Example 31 provides the method according to example 30, further including prior to providing the second structures, performing an etch to form recesses in the first and second doped regions; and providing the second structures so that a portion of an individual second structure is within a respective one of the recesses, where a depth of a recess in a portion of the subfin where a pair of first and second doped regions interfaces is smaller than depth of the recesses in the first and second doped regions.

Example 32 provides the IC device according to any one of the preceding examples, where the IC device includes or is a part of a central processing unit.

Example 33 provides the IC device according to any one of the preceding examples, where the IC device includes or is a part of a memory device, e.g., a high-bandwidth memory device.

Example 34 provides the IC device according to any one of the preceding examples, where the IC device further includes a plurality of memory cells, each of the memory cells including a storage element.

Example 35 provides the IC device according to example 34, where the storage element is one of a capacitor, a magnetoresistive material, a ferroelectric material, or a resistance-changing material.

Example 36 provides the IC device according to any one of the preceding examples, where the IC device includes or is a part of a logic circuit.

Example 37 provides the IC device according to any one of the preceding examples, where the IC device includes or is a part of input/output circuitry.

Example 38 provides the IC device according to any one of the preceding examples, where the IC device includes or is a part of an FPGA transceiver.

Example 39 provides the IC device according to any one of the preceding examples, where the IC device includes or is a part of an FPGA logic.

Example 40 provides the IC device according to any one of the preceding examples, where the IC device includes or is a part of a power delivery circuitry.

Example 41 provides the IC device according to any one of the preceding examples, where the IC device includes or is a part of a III-V amplifier.

Example 42 provides the IC device according to any one of the preceding examples, where the IC device includes or is a part of PCIE circuitry or DDR transfer circuitry.

Example 43 provides an IC package that includes a die comprising an IC device according to any one of the preceding examples; and a further IC component, coupled to the die.

Example 44 provides the IC package according to example 43, where the further IC component includes one of a package substrate, an interposer, or a further IC support structure.

Example 45 provides a computing device that includes a carrier substrate and an IC device, coupled to the carrier substrate, where the IC device is an IC device according to any one of the preceding examples, or the IC device is included in the IC package according to any one of examples 43-44.

Example 46 provides the computing device according to example 45, where the computing device is a wearable or handheld computing device.

Example 47 provides the computing device according to examples 45 or 465, where the computing device further includes one or more communication chips and an antenna.

Example 48 provides the computing device according to any one of examples 45-47, where the carrier substrate is a motherboard.

Example 49 provides a method of manufacturing an IC device, the method including providing the IC device according to any one of the preceding examples.

The invention claimed is:

1. An integrated circuit (IC) device, comprising:

an elongated semiconductor structure including a plurality of alternating first and second doped regions adjacent to one another along an axis, the first and second doped regions being regions of one or more semiconductor materials with different types of dopants;

a stack of nanoribbons over the first and second doped regions;

a plurality of first structures spaced apart from each other along the axis, wherein an individual first structure extends vertically away from one of the first and second doped regions and includes an electrically conductive material at least partially wrapping around the nanoribbons of the stack; and a plurality of second structures spaced apart from each other by at least one of the first structures, wherein an individual second structure extends vertically away from one of the first and second doped regions and includes a semiconductor material at least partially wrapping around or extending through each of the nanoribbons of the stack;

wherein a distance between a nearest-neighbor pair of two of the first structures with one of the second structures is greater than a distance between a nearest-neighbor pair of two of the first structures with none of the second structures.

2. The IC device according to claim 1, wherein the individual second structure includes a portion enclosed by the one of the first and second doped regions.

3. The IC device according to claim 2, wherein:

the axis is a first axis, along a second axis, a dimension of the portion of the individual second structure enclosed by the one of the first and second doped regions is between 20% and 80% of a dimension of the one of the first and second doped regions, and the second axis is perpendicular to the first axis.

4. The IC device according to claim 1, wherein a distance between the nearest-neighbor pair of two of the first structures with one of the second structures is between 110% and 140% of a distance between the nearest-neighbor pair of two of the first structures with none of the second structures.

5. The IC device according to claim 1, wherein:

one of the nearest-neighbor pair of two of the first structures with none of the second structures extends away from one of the first doped regions, another one of the nearest-neighbor pair of two of the first structures with none of the second structures extends away from one of the second doped regions, and the one of the second doped regions is adjacent to the one of the first doped regions.

6. The IC device according to claim 1, wherein:

a recess is in at least one of the first doped regions or one of the second doped regions adjacent to the one of the first doped regions and between the nearest-neighbor pair of two of the first structures with none of the second structures, the axis is a first axis, and along a second axis, a dimension of the recess is less than 30% of the dimension of the one of the first and second doped regions.

7. The IC device according to claim 1, wherein the stack of nanoribbons comprises:

a first stack of nanoribbons over one of the first doped regions, and a second stack of nanoribbons over one of the second doped regions adjacent to the one of the first doped regions.

8. The IC device according to claim 1, wherein:

the semiconductor material of one of the second structures extending away from one of the first doped regions includes one of P-type dopants or N-type dopants, and the semiconductor material of one of the second structures extending away from one of the second doped regions includes another one of P-type dopants or N-type dopants.

9. The IC device according to claim 1, wherein a dopant concentration of the semiconductor material of the second structures is at least $10^{19}$ dopants per square centimeter.

10. The IC device according to claim 1, wherein the dopants of the first doped regions are one of P-type dopants or N-type dopants and the dopants of the second doped regions are another one of P-type dopants or N-type dopants.

11. The IC device according to claim 1, wherein:

the axis is a first axis, and a dimension of each of the plurality of alternating first and second doped regions along a second axis is about 50 to 150 nanometers.

12. The IC device according to claim 1, further comprising:

a support structure; and an insulator material enclosing sidewalls of the elongated semiconductor structure, wherein the elongated semiconductor structure extends away from the support structure, and wherein a dimension of the elongated semiconductor structure along the axis is larger than a dimension of the elongated semiconductor structure in a plane perpendicular to the axis and along an axis parallel to the support structure.

13. The IC device according to claim 1, further comprising:

a support structure, wherein:

the plurality of alternating first and second doped regions are over the support structure, and a dopant concentration of one of the first and second doped regions is greater than a dopant concentration of the support structure.

14. An integrated circuit (IC) device, comprising:

a subfin structure including a first doped well and a second doped well adjacent to one another along a first axis;

a first structure extending along a second axis away from the first doped well; and a second structure extending along the second axis away from the second doped well, wherein:

one of the first doped well and the second doped well includes a semiconductor material with P-type dopants, another one of the first doped well and the second doped well includes a semiconductor material with N-type dopants, a first recess extends along the second axis into the first doped well to a first distance, a second recess extends along the second axis into the second doped well to a second distance, a third recess extends along the second axis into at least one of the first doped well or the second doped well to a third distance shorter than the first distance and the second distance, a portion of the first structure is within the first recess, a portion of the second structure is within the second recess, a portion of the first doped well is a first portion of a bottom of the third recess, and a portion of the second doped well is a second portion of the bottom of the third recess.

15. The IC device according to claim 14, further comprising:

a first stack of nanoribbons over the first doped well; and a second stack of nanoribbons over the second doped well;

wherein:

the first structure includes a semiconductor material at least partially wrapping around or extending through the nanoribbons of the first stack, and the second structure includes a semiconductor material at least partially wrapping around or extending through the nanoribbons of the second stack.

16. The IC device according to claim 14, wherein the first distance or the second distance is between about 40% and 60% of a dimension of the first and second doped wells along the second axis.

17. The IC device according to claim 14, wherein:

the portion of the first structure includes an additional semiconductor material.

18. The IC device according to claim 17, further comprising:

a first stack of nanoribbons over the first doped well; and a second stack of nanoribbons over the second doped well;

wherein:

the additional semiconductor material is a first additional semiconductor material, the first additional semiconductor material at least partially wraps around or extends through the nanoribbons of the first stack, and the second structure includes a second additional semiconductor material at least partially wrapping around or extending through the nanoribbons of the second stack.

19. An integrated circuit (IC) device, comprising:

a subfin structure including a first doped well and a second doped well adjacent to one another along a first axis;

a first structure extending along a second axis away from the first doped well; and a second structure extending along the second axis away from the second doped well, wherein:

one of the first doped well and the second doped well includes a semiconductor material with P-type dopants, another one of the first doped well and the second doped well includes a semiconductor material with N-type dopants, a first recess extends along the second axis into the first doped well to a first distance, a second recess extends along the second axis into the second doped well to a second distance, the first distance or the second distance is between about 40% and 60% of a dimension of the first and second doped wells along the second axis, a third recess extends along the second axis into at least one of the first doped well or the second doped well to a third distance shorter than the first distance and the second distance, a portion of the first doped well is a first portion of a bottom of the third recess, a portion of the second doped well is a second portion of the bottom of the third recess, a portion of the first structure is within the first recess, and a portion of the second structure is within the second recess.

20. The IC device according to claim 19, wherein:

the first structure includes a first semiconductor material, and the second structure includes a second semiconductor material.

21. An integrated circuit (IC) package, comprising:

an IC device; and an IC component coupled with the IC device, wherein the IC device includes:

an elongated semiconductor structure including a plurality of alternating first and second doped regions adjacent to one another along an axis, the first and second doped regions being regions of one or more semiconductor materials with different types of dopants, a stack of nanoribbons over the first and second doped regions, a plurality of first structures spaced apart from each other along the axis, wherein an individual first structure extends vertically away from one of the first and second doped regions and includes an electrically conductive material at least partially wrapping around the nanoribbons of the stack, and a plurality of second structures spaced apart from each other by at least one of the first structures, wherein an individual second structure extends vertically away from one of the first and second doped regions and includes a semiconductor material at least partially wrapping around or extending through each of the nanoribbons of the stack, wherein a distance between a nearest-neighbor pair of two of the first structures with one of the second structures is greater than a distance between a nearest-neighbor pair of two of the first structures with none of the second structures.

22. The IC package according to claim 21, wherein the IC component includes one of a package substrate, an interposer, or a further IC support structure.

* * * * *